United States Patent
You et al.

(10) Patent No.: US 10,454,317 B2
(45) Date of Patent: Oct. 22, 2019

(54) WIRELESS POWER TRANSMISSION DEVICE AND WIRELESS POWER TRANSMISSION SYSTEM FOR WIRELESS POWER TRANSMISSION WITHOUT A POWER TRANSMISSION COIL CHANGE

(71) Applicant: LS Cable & System LTD., Anyang-si, Gyeonggi-do (KR)

(72) Inventors: Sung-Han You, Seoul (KR); Jae-Sun Lee, Seoul (KR); Young-Sun Kim, Gunpo-si (KR); Jae-Hun Jung, Anyang-si (KR); Un-Kyu Park, Seoul (KR)

(73) Assignee: LS CABLE & SYSTEM LTD., Anyang-si, Gyeonggi-Do (KR)

( * ) Notice: Subject to any disclaimer, the term of this patent is extended or adjusted under 35 U.S.C. 154(b) by 326 days.

(21) Appl. No.: 15/521,478

(22) PCT Filed: Oct. 26, 2015

(86) PCT No.: PCT/KR2015/011295
§ 371 (c)(1),
(2) Date: Apr. 24, 2017

(87) PCT Pub. No.: WO2016/064254
PCT Pub. Date: Apr. 28, 2016

(65) Prior Publication Data
US 2017/0324282 A1 Nov. 9, 2017

(30) Foreign Application Priority Data
Oct. 24, 2014 (KR) .................. 10-2014-0145145

(51) Int. Cl.
*H02J 50/40* (2016.01)
*H02J 50/12* (2016.01)
(Continued)

(52) U.S. Cl.
CPC .............. *H02J 50/40* (2016.02); *H02J 7/00* (2013.01); *H02J 7/025* (2013.01); *H02J 50/00* (2016.02);
(Continued)

(58) Field of Classification Search
CPC .. H02J 50/40; H02J 7/025; H02J 50/12; H02J 50/00; H02J 7/00; H03H 7/38; H03H 11/28
See application file for complete search history.

(56) References Cited

U.S. PATENT DOCUMENTS

2012/0187771 A1\* 7/2012 Kamata .................. H02J 7/025
307/104
2012/0293118 A1\* 11/2012 Kim ........................ H02J 5/005
320/108
2013/0127256 A1 5/2013 Kim et al.

FOREIGN PATENT DOCUMENTS

JP 2013-051864 A 3/2013
KR 10-2012-0084659 A 7/2012
(Continued)

OTHER PUBLICATIONS

International Search Report for PCT/KR2015/011295 dated Mar. 10, 2016 from Korean Intellectual Property Office.

*Primary Examiner* — Jared Fureman
*Assistant Examiner* — Michael J Warmflash
(74) *Attorney, Agent, or Firm* — K&L Gates LLP

(57) ABSTRACT

A wireless power transmission device for wirelessly transmitting power to at least one wireless power reception device through a magnetic field, the wireless power transmission device including: a power transmission unit for generating a magnetic field, an impedance matching unit, and a control unit for controlling the impedance matching unit, the impedance matching unit including: a plurality of first circuits which include a capacitor or an inductor and are (Continued)

connected in series to the power transmission unit; a plurality of second circuits which include a capacitor or an inductor and are connected in parallel to the power transmission unit; a matching inductor which is connected in series to the second circuits; and a plurality of switches which are arranged in the first circuits and second circuits and open and close same.

9 Claims, 7 Drawing Sheets

(51) Int. Cl.
*H02J 7/02* (2016.01)
*H03H 11/28* (2006.01)
*H02J 7/00* (2006.01)
*H02J 50/00* (2016.01)
*H03H 7/38* (2006.01)

(52) U.S. Cl.
CPC ............... *H02J 50/12* (2016.02); *H03H 7/38* (2013.01); *H03H 11/28* (2013.01)

(56) References Cited

FOREIGN PATENT DOCUMENTS

| | | |
|---|---|---|
| KR | 10-2012-0129821 A | 11/2012 |
| KR | 10-2013-0005571 A | 1/2013 |
| KR | 10-2013-0055328 A | 5/2013 |
| KR | 10-2014-0112780 A | 9/2014 |

* cited by examiner

WIRELESS POWER TRANSMISSION DEVICE AND WIRELESS POWER TRANSMISSION SYSTEM FOR WIRELESS POWER TRANSMISSION WITHOUT A POWER TRANSMISSION COIL CHANGE

CROSS REFERENCE TO PRIOR APPLICATIONS

This application is a National Stage Patent Application of PCT International Patent Application No. PCT/KR2015/011295 (filed on Oct. 26, 2015) under 35 U.S.C. § 371, which claims priority to Korean Patent Application No. 10-2014-0145145 (filed on Oct. 24, 2014), which are all hereby incorporated by reference in their entirety.

BACKGROUND

Embodiments of the present invention relate to a wireless power transmission device and a wireless power transmission system.

Wireless power transmission is a technique of wirelessly supplying power to household appliances or electric cars rather than using a power line which is an existing wire. This technique is advantageous in that a device which needs to be supplied with power can be charged wirelessly without connecting the device to a power outlet using a power cable. Thus, research related thereto has been actively conducted.

Wireless power transmission techniques are largely divided into a magnetic induction method, a magnetic resonance method, and a microwave method. The magnetic induction method is a technique using magnetic inductive coupling between adjacent coils. In the magnetic induction method, the distance between two power transmission/reception coils is several centimeters or less and transmission efficiency depends greatly on the arrangement of the two coils. The magnetic resonance method is a technique of transmitting non-radial magnetic-field energy between two separate resonators through resonant coupling. In the magnetic resonance method, wireless power transmission may be performed when the distance between power transmission/reception coils is about 1 to 2 m. The magnetic resonance method is more advantageous than the magnetic induction method, in that an arrangement of two coils is relatively flexible and a range of wireless charging may be extended according to a relay method. The microwave method is a technique of transmitting power by emitting super-high-frequency electromagnetic waves such as microwaves via an antenna. When the microwave method is used, long-distance wireless power transmission can be conducted but a safety problem caused by electromagnetic waves should be considered.

A wireless power transmission system includes a wireless power transmission device which wirelessly transmits power, and a wireless power reception device which wirelessly receives the power. Generally, when the wireless power transmission device and the wireless power reception device have the same resonant frequency, maximum power transmission may occur in the wireless power transmission system.

The resonant frequency may vary according to the distance between the wireless power transmission device and the wireless power reception device or locations of the wireless power transmission device and the wireless power reception device. That is, in order to achieve maximum power transmission in the wireless power transmission system, a condition that the wireless power transmission device and the wireless power reception device should have the same resonant frequency should be satisfied. For example, the distance between the wireless power transmission device and the wireless power reception device should be a specific value or the wireless power transmission device and the wireless power reception device should be located at specific positions. When the distance between the wireless power transmission device and the wireless power reception device or the locations thereof are changed and a condition of transmitting a maximum amount of power from the wireless power transmission device to the wireless power reception device is thus not satisfied, reactive power increases in the wireless power transmission device, thereby decreasing wireless power transmission efficiency.

To solve this problem, Korean laid-open patent application No. 2012-0129821 suggests that power be transmitted by changing a resonance frequency of a wireless power transmission device. However, when the resonant frequency is changed, the amount of power requested by a wireless power reception device cannot be transmitted without changing an external power source.

In a wireless power transmission system including one wireless power transmission device and two or more wireless power reception devices, when the wireless power transmission device wirelessly transmits power to the two or more wireless power reception devices, loads on the wireless power transmission device increases and thus the amount of power to be transmitted to the loads increases.

Various parameters, such as a Q factor of a power transmission coil, a voltage, circuit efficiency, an inductance, etc., of the wireless power transmission device may be changed so that a wireless power transmission device may transmit power requested by a plurality of wireless power reception devices. The Q factor of the power transmission coil among the parameters or the size of power transmission coil should be increased to transmit the requested power to the wireless power reception devices by changing the power transmission coil of the wireless power transmission device. That is, the amount of power to be transmitted from the wireless power transmission device to the wireless power reception devices may be increased by increasing the Q factor or the size of the power transmission coil of the wireless power transmission device.

However, the size of the wireless power transmission device has been determined according to design, consumers' request, or the like and thus increasing the size of the power transmission coil is limited. Furthermore, it is difficult to manufacture a power transmission coil having a Q factor greater than a certain value. Accordingly, a power transmission coil having a high Q factor is expensive and thus manufacturing costs of the wireless power transmission device increase.

Furthermore, since resonance conditions of wireless power reception devices and wireless power transmission devices are different, wireless power transmission optimized for the wireless power reception devices cannot be conducted. Thus, the wireless power transmission devices or the wireless power reception devices may be heated, and exploded in a worst-case scenario.

SUMMARY

The present invention is mainly directed to a wireless power transmission device capable of wirelessly transmitting requested power to a plurality of wireless power reception devices without changing a power transmission coil, and a wireless power transmission system thereof.

According to an aspect of the present invention, a wireless power transmission device for wirelessly transmitting power to at least one wireless power reception device using a magnetic field, the wireless power transmission device comprises: a power transmitter configured to generate the magnetic field; an impedance matching part configured to adjust an impedance to control the power transmitter to have a resonant frequency; and a controller configured to control the impedance matching part to change an impedance of the impedance matching part so as to maximize efficiency of power transmission to the wireless power reception device while maintaining a predetermined resonant frequency, when a distance between the wireless power transmission device and the wireless power reception device or locations of the wireless power transmission device and the wireless power reception device are changed, wherein the impedance matching part comprises: a plurality of first circuits, each of which includes a capacitor or an inductor, the first circuits being connected in series to the power transmitter; a plurality of second circuits, each of which includes a capacitor or an inductor, the second circuits being connected in parallel to the power transmitter; a matching inductor connected in series to the second circuits; and a plurality of switches respectively included in the first circuits and the second circuits to open or close the first circuits and the second circuits.

According to an embodiment of the present invention, a wireless power transmission device may wirelessly transmit requested power to a plurality of wireless power reception devices without changing a power transmission coil.

DETAILED DESCRIPTION

Figure 1:
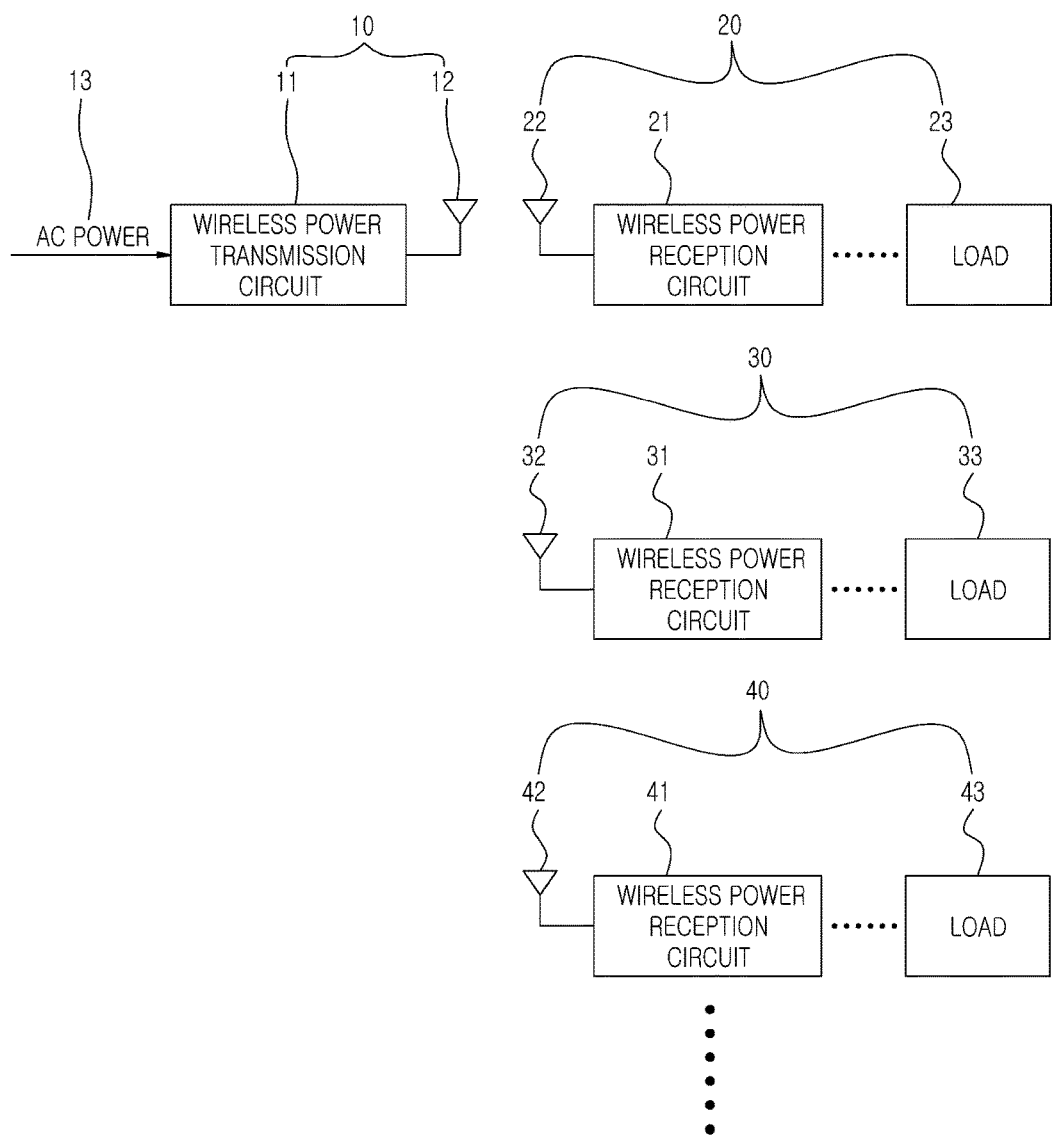
FIG. 1 is a diagram schematically illustrating a structure of a wireless power transmission system according to an embodiment of the present invention.

The present invention may be embodied in many different forms and may be accomplished in various embodiments. Thus, exemplary embodiments will be illustrated in the drawings and described in detail herein. However, the present invention should not be construed as being limited thereto and should be understood to cover all modifications, equivalents, and alternatives falling within the technical idea and scope of the invention.

Exemplary embodiments of the present invention will now be described more fully with reference to the accompanying drawings. In the following description, well-known functions or constructions are not described in detail if it is determined that they would obscure the invention due to unnecessary detail. It will be understood that numbers used herein (e.g., first, second, etc.) are merely signs for distinguishing one element from another element.

It will be further understood that when an element is referred to as being "coupled to" or "connected to" another element, the element can be directly coupled or connected to another element or can be coupled or connected to another element via an intervening element.

In the present disclosure, a charging device is a portable device having a chargeable battery and should be thus understood to include a cellular phone, a smart phone, a laptop computer, a digital broadcasting terminal, a personal digital assistant (PDA), a portable multimedia player (PMP), a navigation device, etc.

Embodiments of the present invention will be described in greater detail with reference to the accompanying drawings below.

FIG. 1 is a diagram schematically illustrating a structure of a wireless power transmission system according to an embodiment of the present invention.

As illustrated in FIG. 1, power may be transmitted between a wireless power transmission device 10 and wireless power reception devices 20, 30, and 40 according to the magnetic induction method or the magnetic resonance method. Although FIG. 1 illustrates the three wireless power reception devices 20, 30, and 40, the present invention is not limited thereto and power may be wirelessly transmitted to at least one wireless power reception device.

The wireless power transmission device 10 may convert alternating current (AC) power supplied from an external power source 13 into an electromagnetic wave signal via a wireless power transmission circuit 11 including a rectifier (not shown), a voltage amplifier (not shown), etc., and transmit the electromagnetic wave signal to the wireless power reception devices 20, 30, and 40 via a power transmitter 12.

The wireless power reception devices 20, 30, and 40 receive the electromagnetic wave signal transmitted from the wireless power transmission device 10. To this end, the wireless power reception devices 20, 30, and 40 may respectively include power receptors 22, 32, and 42.

In the magnetic resonance method, resonant frequencies of the power transmitter 12 and the power receptors 22, 32, and 42 may be the same or substantially the same. In this case, an energy transfer channel is formed between the power transmitter 12 and the power receptors 22, 32, and 42 due to a resonant coupling. An electromagnetic wave emitted from the power transmitter 12 is transferred to the power receptors 22, 32, and 42 via the energy transfer channel. The electromagnetic wave transferred to the power receptors 22, 32, and 42 may be converted into power in the wireless power reception device 20 via a wireless power reception circuit 21 including a impedance matching part (not shown), a rectifier (not shown), etc. The power is transferred to load devices 23, 33, and 43 connected to the wireless power reception circuit 21 to charge the load devices 23, 33, and 43 or provide driving power.

When the magnetic induction method is used, resonant frequencies of the power transmitter 12 and the power receptors 22, 32, and 42 need not be substantially the same but the efficiency of power transmission between the power transmitter 12 and power receptors 22, 32, and 42 may be improved by matching resonant frequencies thereof to be substantially the same.

Figure 2:
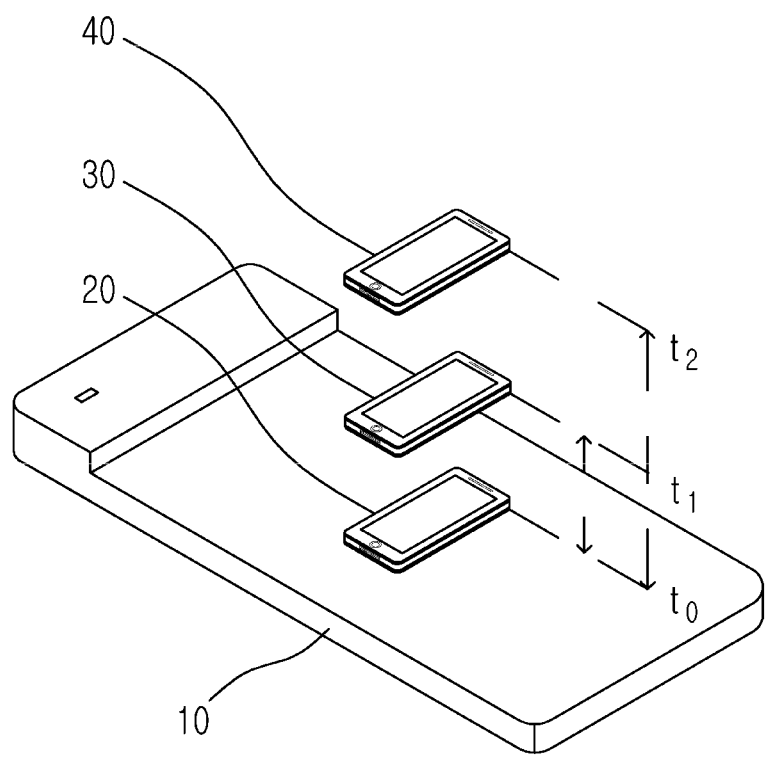
FIG. 2 is a perspective view of the wireless power transmission system of FIG. 1 for explaining an example of a charging operation conducted between a wireless power transmission device and a plurality of wireless power reception devices.

FIG. 2 is a perspective view of the wireless power transmission system of FIG. 1 for explaining an example of a charging operation conducted between a wireless power transmission device and a plurality of wireless power reception devices.

As illustrated in FIG. 2, one wireless power transmission device 10 may wirelessly transmit power to a plurality of wireless power reception devices 20, 30, and 40 to charge the wireless power reception devices 20, 30, and 40. The wireless power reception devices 20, 30, and 40 and the wireless power transmission device 10 have different resonant frequencies at which a maximum amount of power is transmitted. In general, a manufacturer performs impedance matching on the wireless power transmission device 10 and the wireless power reception devices 20, 30, and 40 at a distance (or a position) at which the frequency of use by a user is highest to make resonant frequencies thereof be the same. For example, when the distance between the wireless power transmission device 10 and the wireless power reception device 20 is t0, the wireless power transmission device 10 and the wireless power reception device 20 may be impedance-matched to each other and maximum power transmission may be thus conducted.

However, another user may arrange the other wireless power reception device 30 or 40 at a random point t1 or t2 other than the point t0.

In this case, the wireless power transmission device 10 may be impedance-matched neither to the wireless power reception device 20 nor to the other wireless power reception device 30 or 40. That is, when the wireless power reception devices 20, 30, and 40 are charged by one wireless power transmission device 10, an impedance matching error may occur between the wireless power transmission device 10 and the wireless power reception devices 20, 30, and 40. Thus, reactive power may increase in the wireless power transmission device 10 and the amount of power transmitted to the wireless power reception devices 20, 30, and 40 is thus decreased, thereby decreasing power transmission efficiency.

Furthermore, as the number of wireless power reception devices near the wireless power transmission device 10 increases, the amount of power requested for the wireless power transmission device 10 to transmit (i.e., a total amount of power to be wirelessly transmitted from the wireless power transmission device 10 to the wireless power reception devices) increases. Thus, the wireless power transmission device 10 should increase the amount of power to be wirelessly transmitted to the wireless power reception devices 20, 30, and 40. To increase the amount of power to be wirelessly transmitted, various parameters such as a Q factor of a power transmission coil, a voltage, circuit efficiency, an inductance, etc. of the wireless power transmission device 10 may be changed. The Q factor of the power transmission coil among the parameters or the size of the power transmission coil may be increased to transmit requested power to the wireless power reception devices 20, 30, and 40 by changing the power transmission coil of the wireless power transmission device 10. That is, when the Q factor or the size of the power transmission coil of the wireless power transmission device 10 is increased, a total amount of power to be transmitted from the wireless power transmission device 10 to the wireless power reception devices 20, 30, and 40 may increase.

However, the size of the wireless power transmission device 10 has been determined for various reasons, e.g., design, consumers' request, or the like. Thus, increasing the size of the power transmission coil is limited. Furthermore, it is difficult to manufacture a power transmission coil having a Q factor greater than a certain value. Accordingly, a power transmission coil having a high Q factor is expensive and thus manufacturing costs of the wireless power transmission device 10 increase.

To solve this problem, in the wireless power transmission system according to an embodiment of the present invention, even when the wireless power transmission device 10 charges the wireless power reception devices 20, 30, and 40 other than one wireless power reception device, requested power may be transmitted to the wireless power reception devices 20, 30, and 40 without changing the size or the Q factor of the power transmission coil. Even when the number of chargeable wireless power reception devices is changed, generation of reactive power in the wireless power transmission device 10 may be minimized to transmit power at optimal efficiency from the wireless power transmission device 10 to the wireless power reception devices 20, 30, and 40, as will be described in detail below.

Figure 3:
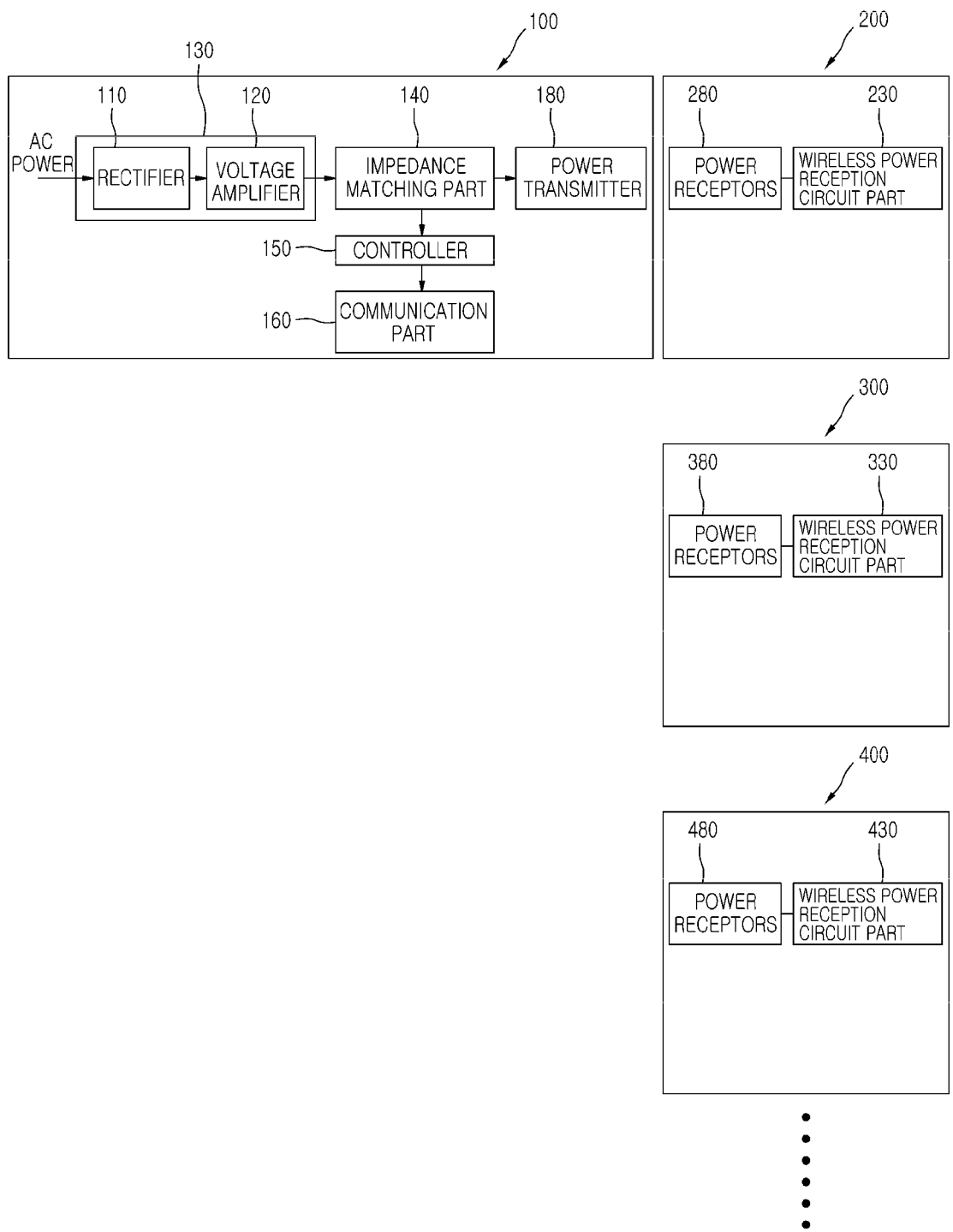
FIG. 3 is a schematic block diagram of a wireless power transmission system according to an embodiment of the present invention.

FIG. 3 is a schematic block diagram of a wireless power transmission system according to an embodiment of the present invention.

Referring to FIG. 3, a wireless power transmission device 100 according to an embodiment of the present invention may include a wireless power transmission circuit part 130, an impedance matching part 140, a controller 150, a communication part 160, and a power transmitter 180. A plurality of wireless power reception devices 200, 300, and 400 may include wireless power reception circuit parts 230, 330, and 430 and power receptors 280, 380, and 480.

External power is supplied to the wireless power transmission device 100. The external power is input to a rectifier 110, and converted into DC power. The DC power may be converted into a voltage by a voltage amplifier 120.

The impedance matching part 140 may be arranged between the power transmitter 180 and the wireless power transmission circuit part 130 to match impedances of the power transmitter 180 and the wireless power transmission circuit part 130. In detail, the impedance matching part 140 may be provided at a front end of the power transmitter 180 to match impedances of the power transmitter 180 and a front end of the impedance matching part 140. To this end, the impedance matching part 140 may include a variable inductor or a variable capacitor, or a parallel array in which a plurality of circuits, each of which is directly connected to a capacitor and a field-effect transistor (FET) switch are connected in parallel with each other. In this case, the variable capacitor or the parallel array may be connected in series or in parallel to the power transmitter 180 to perform impedance matching by changing a capacitance value of the impedance matching part 140.

Figure 4:
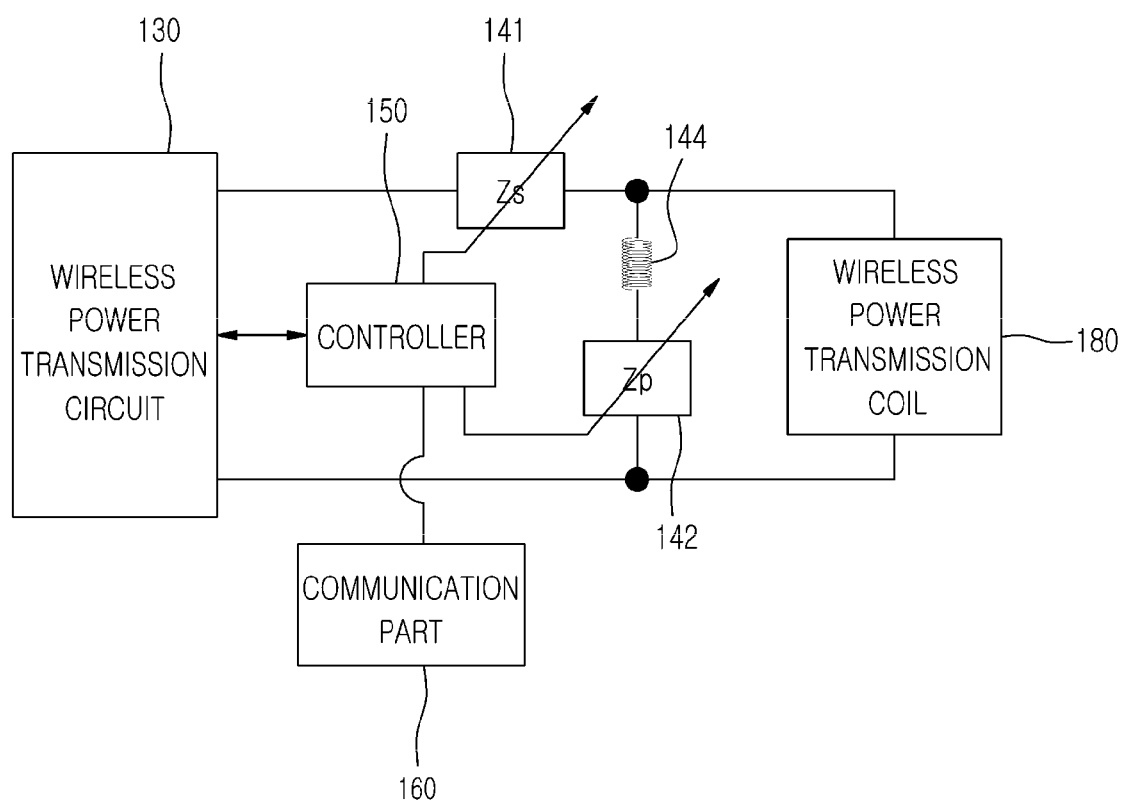
FIG. 4 is a diagram schematically illustrating a structure of a wireless power transmission device according to an embodiment of the present invention.

The impedance matching part 140 may further include a matching inductor 143 of FIG. 4 connected in parallel to the power transmitter 180. The wireless power transmission device 10 may transmit requested power to a plurality of wireless power reception devices owing to the matching inductor 143 without changing the power transmitter 180, as will be described in detail below.

A resonant frequency at which maximum power transmission occurs may change and reactive power may be generated in the wireless power transmission device 100, when the distance between the wireless power transmission device 100 and the wireless power reception device 200 or locations thereof are changed or when the number of the wireless power reception devices 200, 300, and 400 to which power is to be transmitted from the wireless power transmission device 100 is increased. In this case, the reactive power may be removed from the wireless power transmission device 100 by adjusting an impedance of the impedance matching part 140 without changing a predetermined resonance frequency of the wireless power transmission device 100, and active power requested by the wireless power reception device 200 may be transmitted, as will be described in detail below.

The controller 150 may control the impedance matching part 140 to have an impedance at which the efficiency of power transmission to the wireless power reception device 200 is maximum while maintaining a predetermined resonant frequency between the wireless power transmission device 100 and the wireless power reception device 200, when the distance between the wireless power transmission device 100 and the wireless power reception device 200 or locations thereof are changed or when the number of the wireless power reception devices 200, 300, and 400 to which power is to be transmitted from the wireless power transmission device 100 is increased.

The predetermined resonant frequency means a frequency at which the wireless power transmission device 100 and the wireless power reception device 200 are in a resonance state at a specific location. As described above, a manufacturer matches impedances of the wireless power transmission device 100 and the wireless power reception device 200 at a distance (or a location) at which the frequency of use by a user is highest to make resonant frequencies thereof be the same. The resonant frequency at the specific location is the predetermined resonant frequency.

When the distance between the wireless power transmission device 100 and the wireless power reception device 200 or locations thereof are changed or when the number of the wireless power reception devices 200, 300, and 400 to which power is to be transmitted from the wireless power transmission device 100 is increased, an impedance matching error occurs due to a mutual inductance between the power transmitter 180 and the power receptor 280. Thus, reactive power is generated in the wireless power transmission device 100 and the wireless power transmission device 100 is thus heated, thereby decreasing power transmission efficiency.

In the related art, when an impedance matching error is generated as described above, power is transmitted by changing a resonance frequency of a wireless power transmission device. However, when the resonant frequency is changed, power requested by the wireless power reception device cannot be transmitted without changing an external power source. That is, when reactive power is minimized by changing the resonant frequency of the wireless power transmission device, active power decreases and thus the amount of power to be transmitted to the wireless power reception device decreases unless the external power source is increased.

However, according to an embodiment of the present invention, the controller 150 may control the impedance matching part 140 to have an impedance at which reactive power of the wireless power transmission device 100 is minimum and power transmission efficiency is maximum while maintaining the predetermined resonant frequency, when power transmission condition is changed (when the distance between the wireless power transmission device 100 and the wireless power reception device 200 or locations thereof are changed or when the number of the wireless power reception devices 200, 300, and 400 to which power is to be transmitted from the wireless power transmission device 100 is increased). Thus, the wireless power transmission device 100 according to an embodiment of the present invention may transmit requested power to the wireless power reception device 200 even when a charging condition is changed.

When the number of the wireless power reception devices 200, 300, and 400 to which power is to be transmitted from the wireless power transmission device 100 is increased, loads on the wireless power transmission device 10 increases and thus the amount of power to be transmitted to the loads increases.

In the related art, in order to increase the amount of power to be wirelessly transmitted to wireless power reception devices, various parameters such as a Q factor of a power transmission coil, a voltage, circuit efficiency, an inductance, etc. of a wireless power transmission device are changed. The Q factor of the power transmission coil among the parameters or the size of the power transmission coil should be increased to transmit requested power to a plurality of wireless power reception devices by changing the power transmission coil of the wireless power transmission device. That is, the amount of power to be transmitted from the wireless power transmission device to the wireless power reception devices may be increased by increasing the Q factor or the size of the power transmission coil.

However, the size of the wireless power transmission device has been determined according to design, consumers' request, or the like and thus increasing the size of the power transmission coil is limited. Furthermore, it is difficult to manufacture a power transmission coil having a Q factor greater than a certain value. Accordingly, a power transmission coil having a high Q factor is expensive and thus manufacturing costs of the wireless power transmission device increase.

According to an embodiment of the present invention, requested power may be transmitted to the plurality of wireless power reception devices 200, 300, and 400 without changing a power transmission coil of the power transmitter 180 by connecting a matching inductor 144 in parallel to a power transmission coil of the power transmitter 180 and controlling an impedance of the impedance matching part 140 having the matching inductor 144.

The communication part 160 may receive information regarding power received by the wireless power reception devices 200, 300, and 400 from the wireless power reception devices 200, 300, and 400. That is, the communication part 160 may receive the information regarding the power (received power) transmitted from the wireless power transmission device 100 to the wireless power reception devices 200, 300, and 400 and information regarding a current and voltages of the power receptors 280, 380, and 480 in real time from the wireless power reception devices 200, 300, and 400. The information regarding the received power received by the communication part 160 may be transmitted to the controller 150 and the controller 150 may calculate power transmission efficiency and an impedance for minimizing reactive power according to this information, and control the impedance matching part 140 on the basis of the power transmission efficiency and the impedance, as will be described in detail below.

The power transmitter 180 may wirelessly transmit power. For example, the power transmitter 180 may transmit power to the wireless power reception device 200 according to a control signal from the controller 160 which will be described below. In this case, the power may be transmitted in the form of a radio-frequency (RF) energy signal. The power transmitter 180 and the power receptor may have the same or substantially the same resonant frequency. When the power transmitter 180 and the power receptor have the same resonant frequency, maximum power transmission may occur.

The power transmitter 180 may have various structures according to a wireless power transmission method. For example, when the wireless power transmission system is implemented according to the magnetic induction method, the power transmitter 180 may be configured as a single loop antenna. In contrast, when the wireless power transmission system is implemented according to the magnetic resonance method, the power transmitter 180 may be configured as a pair of power-transmission resonance coils, together with a power transmission coil. Alternatively, the power transmitter 180 may be configured in the form of loop. For example, the power transmitter 180 may have a form of spiral loop or helical loop.

When a power transmission condition is changed, and particularly, when the number of the wireless power reception devices 200, 300, and 400 to which power is to be transmitted from the wireless power transmission device 100 is increased, the amount of power to be transmitted from the wireless power transmission device 100 increases. Thus, the size or the Q factor of the power transmission coil of the power transmitter 180 should be increased. However, when the matching inductor 144 is connected in parallel to the power transmission coil of the power transmitter 180 and impedance matching is performed, the wireless power transmission device 100 may transmit requested power to the wireless power reception devices 200, 300, and 400 without changing the power transmission coil of the power transmitter 180.

Figure 5:
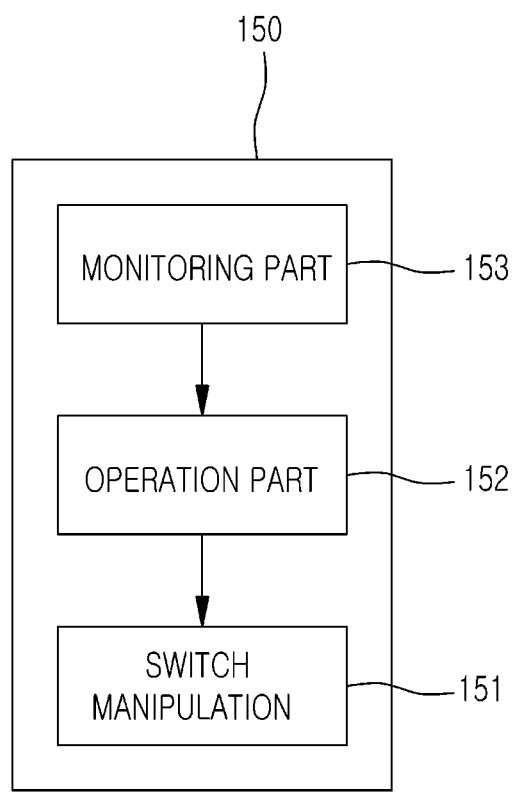
FIG. 5 is a schematic block diagram of a controller of FIG. 4.
Figure 6:
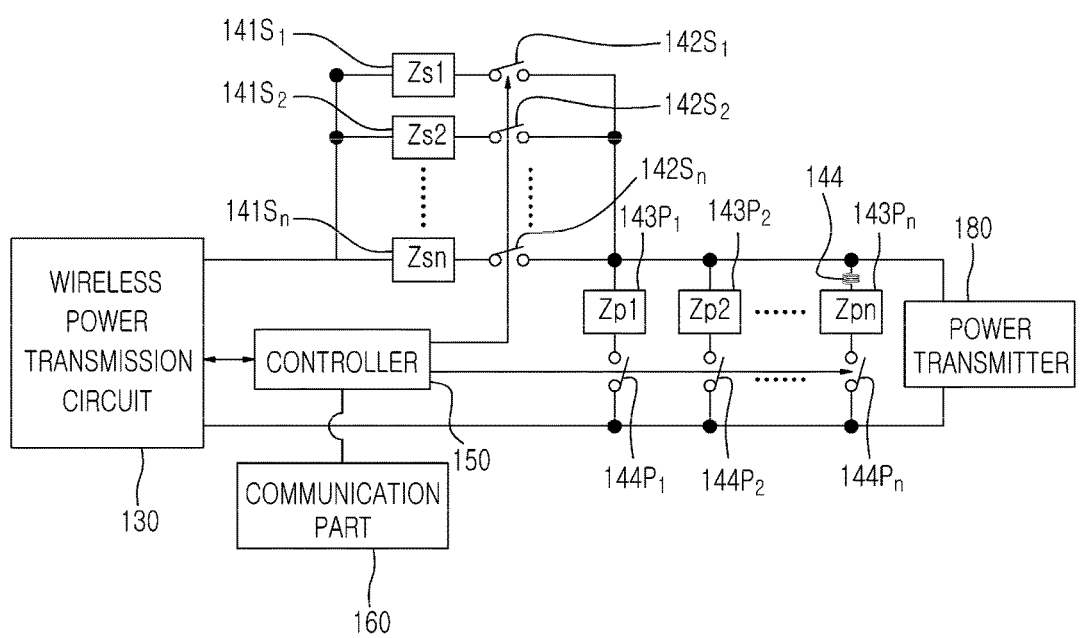
FIG. 6 is a diagram schematically illustrating a wireless power transmission device according to another embodiment of the present invention.

FIG. 4 is a diagram schematically illustrating a structure of a wireless power transmission device according to an embodiment of the present invention. FIG. 5 is a schematic block diagram of a controller of FIG. 4. FIG. 6 is a diagram schematically illustrating a modified example of the wireless power transmission device of FIG. 4.

Referring to FIGS. 4 and 6, the impedance matching part 140 may include a first circuit 141, a second circuit 142, the matching inductor 144, and switches 141S1, 141S2, . . . , 141Sn, 143P1, 143P2, . . . , 143Pn of FIG. 6.

The first circuit 141 may be connected in series to the power transmitter 180, and include at least one capacitor or inductor. The at least one capacitor or inductor may be connected in series or in parallel to each other in various fashions.

The second circuit 142 may be connected in series to the power transmitter 180, and include at least one capacitor or inductor. The at least one capacitor or inductor may be connected in series or in parallel to each other in various fashions.

The matching inductor 144 is connected in series to the second circuit 142 and is thus located in parallel to the power transmitter 180.

The first circuit 141 and the second circuit 142 may include a plurality of switches for opening or closing the first circuit 141 and the second circuit 142. Each of the switches may be connected to one of the at least one capacitor or inductor of the first circuit 141 or the second circuit 142 to short-circuit or disconnect the capacitor or inductor.

The controller 150 may control the short-circuiting or disconnecting performed by the switches to control an impedance of the whole impedance matching part 140. In detail, the controller 150 control an impedance of the first circuit 141 and an impedance of the second circuit 142 to maximize power transmission efficiency while maintaining a predetermined resonant frequency, and control the sum of the impedance of the first circuit 141, the impedance of the second circuit 142, and the matching inductor 144 to be maintained at a constant level.

For example, if both the first circuit 141 and the second circuit 142 include capacitors, the controller 150 may control the first circuit 141 and the second circuit 142 to satisfy Formula 1 below when a total capacitance of the first circuit 141 is Cs, a total capacitance of the second circuit 142 is Cp, and an inductance of the matching inductor 144 is Lp.

In Formula 1 below, w represents a predetermined resonant frequency, and k represents a coupling coefficient.

$$\left(C_p + \frac{1}{w^2 L_p}\right)(C_s - (k-1)) = \frac{1}{w^4 L_p^2}$$ [Formula 1]

The controller 150 may satisfy Formula 1 above, receive information regarding power received from the wireless power transmission device 100 to the wireless power reception devices 200, 300, and 400, calculate an impedance at which maximum power transmission efficiency is achieved with respect to the received power, and control the impedance matching part 140 according to the impedance.

The controller 150 may control an impedance of the second circuit 142 to control the received power requested by the wireless power reception devices 200, 300, and 400. That is, the second circuit 142 is connected in parallel to the power transmitter 180 and thus active power is proportional to the impedance of the second circuit 142. Thus, the controller 150 may control the impedance of the second circuit 142 to control active power.

Figure 7:
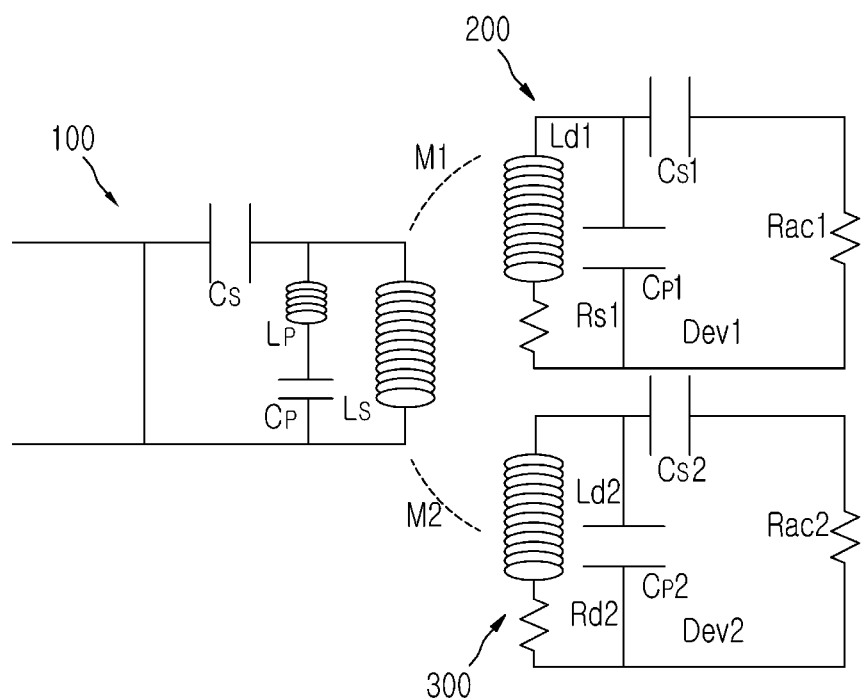
FIG. 7 is a circuit diagram of an equivalent circuit of a wireless power transmission system according to an embodiment of the present invention.

FIG. 7 is a circuit diagram of an equivalent circuit of a wireless power transmission system according to an embodiment of the present invention. That is, FIG. 7 illustrates an equivalent circuit 100 of the wireless power transmission device of FIG. 4 and two equivalent circuits 200 and 300 of the wireless power reception device of FIG. 4.

Referring to FIG. 7, Cs represents a total capacitance of the first circuit 141 of FIG. 4, Cp represents a total capacitance of the second circuit 142 of FIG. 4, Lp represents an inductance of the matching inductor 144, Ld1 and Rs1 represent equivalent circuits of the power receptor 280 of FIG. 3, Ld2 and Rs2 represent equivalent circuits of the power receptor 380 of FIG. 3, Rs1, Cs1, and Rac1 represent equivalent circuits of the wireless power reception circuit part 230 of FIG. 3, and Rs2, Cs2, and Rac2 represent equivalent circuits of the wireless power reception circuit part 330 of FIG. 3.

When the inductance Lp of the matching inductor 144 satisfies Formula 2 below, requested power may be transmitted to the wireless power reception devices 200, 300, and 400 without changing the power transmission coil of the power transmitter 180.

$$Lp > \frac{\frac{8}{\pi^2} V_{in}^2}{2\pi f P_{req}} \frac{Q}{\sqrt{1 + U_1^2 + U_2^2}} \sqrt{1 - \left(1 - \frac{R_s \sqrt{1 + U_1^2 + U_2^2}}{\frac{8}{\pi^2} V_{in}^2}\right)\left(1 + \frac{1}{\left(\frac{Q}{\sqrt{1 + U_1^2 + U_2^2}}\right)^2}\right)}$$ [Formula 2]

Here, $U_i = k_i\sqrt{Q_s Q_D}$, Qs represents a Q factor of a power transmitter coil Ls, QD represents Q factors of power receptor coils Ld1 and Ld2, Vin represents a DC voltage applied to the wireless power transmission device 100, Preq represents power requested by the wireless power reception device 200, and Q is the same as Qs.

If the inductance Lp of the matching inductor 144 satisfies Formula 2 above, a coupling coefficient between the wireless power transmission device 100 and the wireless power reception devices 200 and 300 is higher than when the wireless power transmission device 100 does not include the matching inductor 144. The coupling coefficient is inversely proportional to the distance between the wireless power transmission device 100 and the wireless power reception devices 200 and 300. Thus, even when the wireless power transmission device 100 and the wireless power reception devices 200 and 300 are within a short distance, wireless power charging may be performed with maximum power transmission efficiency.

More specifically, if the wireless power transmission device 100 does not include the matching inductor 144 and the coupling coefficient between the wireless power transmission device 100 and the wireless power reception devices 200 and 300 is greater than or equal to a predetermined value, impedance matching does not occur between the wireless power transmission device 100 and the wireless power reception devices 200 and 300 even when the impedance matching part 140 is controlled. Thus, the efficiency of power transmission from the wireless power transmission device 100 to the wireless power reception devices 200 and 300 is low. Since the coupling coefficient is inversely proportional to a distance, that the coupling coefficient is greater than or equal to the predetermined value should be understood to mean that the distance between the wireless power transmission device 100 and the wireless power reception devices 200 and 300 is equal to or less than a predetermined distance. Thus, if the distance between the wireless power transmission device 100 and the wireless power reception devices 200 and 300 is equal to or greater than the predetermined distance, impedance matching does not occur between the wireless power transmission device 100 and the wireless power reception devices 200 and 300 even when the impedance matching part 140 is controlled. That is, the efficiency of power transmission from the wireless power transmission device 100 to the wireless power reception devices 200 and 300 is low.

In contrast, if the wireless power transmission device 100 includes the matching inductor 144 according to an embodiment of the present invention, impedance matching may occur between the wireless power transmission device 100 and the wireless power reception devices 200 and 300 with a higher coupling coefficient than when the wireless power transmission device 100 does not include the matching inductor 144. That is, even when the wireless power transmission device 100 and the wireless power reception devices 200 and 300 are within a shorter distance, impedance matching may occur and maximum power transmission efficiency may be achieved.

FIG. 5 is a schematic block diagram of the controller 150 of FIG. 4.

Referring to FIG. 5, the controller 150 may include a monitoring part 151, an operation part 152, and a switch manipulation part 153.

The monitoring part 151 may monitor a change in power transmission efficiency on the basis of information regarding received power received from the wireless power reception device 200 and information regarding power transmitted from the wireless power transmission device 100. That is, the monitoring part 151 may receive the information regarding the received power and the information regarding the transmitted power in real time, and calculate the power transmission efficiency by dividing the received power by the transmitted power.

The operation part 152 may calculate an impedance of the impedance matching part 140 at which maximum power transmission efficiency is achieved on the basis of the power transmission efficiency calculated by the monitoring part. The operation part 152 may calculate an impedance of the impedance matching part 140, at which the matching inductor 144, an impedance of the first circuit 141, and an impedance of the second circuit 142 satisfy Formula 1 above while a predetermined resonant frequency is maintained.

The switch manipulation part 153 may control the switch of the first circuit 141 or the second circuit 142 of the impedance matching part 140 such that the impedance matching part 140 has the impedance at which maximum power transmission efficiency is achieved.

FIG. 6 illustrates modified examples of the first circuit 141 and the second circuit 142.

Referring to FIG. 6, the first circuit 141 may include a plurality of impedance elements 141S1, 141S2, . . . , 141Sn connected in parallel to one another, and switches 142S1, 142S2, . . . , 142Sn connected in series to the impedance elements 141S1, 141S2, . . . , 141Sn to short-circuit or disconnect the impedance elements 141S1, 141S2, . . . , 141Sn. The second circuit 142 may include a plurality of impedance elements 143P1, 143P2, . . . , 143Pn connected in parallel to one another, and switches 144P1, 144P2, . . . , 144Pn connected in series to the impedance elements 143P1, 143P2, . . . , 143Pn to short-circuit or disconnect the impedance elements 143P1, 143P2, . . . , 143Pn. The controller 150 may control the switches 142S1, 142S2, . . . , 142Sn and the switches 144P1, 144P2, . . . , 144Pn to control impedances of the first circuit 141 and the second circuit 142.

The present disclosure is merely provided to explain the technical idea of the present invention. Thus, it would be appreciated by those of ordinary skill in the art that changes may be made in the present invention without departing from the essential features of the invention.

Thus, the embodiments set forth herein are not intended to restrict the scope of the present invention and are only used for a better understanding of the present invention. Accordingly, the scope of the present invention is not limited by these elements.

Therefore, the scope of the invention should be defined by the appended claims, and all differences within the scope will be construed as being included in the present invention.

The invention claimed is:

1. A wireless power transmission device for wirelessly transmitting power to at least one wireless power reception device using a magnetic field, the wireless power transmission device comprising:
   a wireless power transmission circuit part comprising:
      a rectifier configured to convert external input power into direct-current (DC) power; and
      a voltage amplifier configured to convert a voltage of the DC power received from the rectifier;
   a power transmitter configured to generate the magnetic field from the DC power, the voltage of which is converted by the wireless power transmission circuit part;

an impedance matching part configured to match impedances of the power transmitter and the wireless power transmission circuit part, the impedance matching part being arranged between the power transmitter and the wireless power transmission circuit part; and
a controller configured to control the impedance matching part,
wherein the impedance matching part comprises a variable inductor or a variable capacitor,
wherein the controller controls an impedance of the impedance matching part while maintaining a predetermined resonance frequency, according to a change in a power transmission condition based on information received from the wireless power reception device by the wireless power transmission device,
wherein the impedance matching part comprises:
  a first circuit connected in series to the power transmitter, the first circuit including at least one capacitor and at least one switch for short-circuiting or disconnecting the capacitor; and
  a second circuit connected in parallel to the power transmitter, the second circuit including at least one capacitor and at least one switch for short-circuiting or disconnecting the capacitor,
wherein the impedance matching part further comprises a matching inductor connected in parallel to the power transmitter and connected in series to the second circuit, and
wherein the controller controls a capacitance of the first circuit and a capacitance of the second circuit to satisfy the following equation:

$$\left(C_p + \frac{1}{w^2 L_p}\right)(C_s - (k-1)) = \frac{1}{w^4 L_p^2},$$

wherein Cs represents a total capacitance of the first circuit, Cp represents a total capacitance of the second circuit, Lp represents an inductance of the matching inductor, W represents the predetermined resonance frequency, and k represents a coupling coefficient.

2. The wireless power transmission device of claim 1, wherein the controller comprises:
  a monitoring part configured to monitor a change in power transmission efficiency on the basis of information regarding received power received from the wireless power reception device and information regarding the power transmitted from the wireless power transmission device;
  an operation part configured to calculate an impedance of the impedance matching part at which the power transmission efficiency is maximum by using the power transmission efficiency calculated by the monitoring part; and
  a switch manipulation part configured to control the switches of the impedance matching part to make the impedance matching part have the impedance calculated by the operation part.

3. The wireless power transmission device of claim 1, further comprising a communication part configured to receive information regarding received power from the wireless power reception device, and transmit the information regarding the received power to the controller.

4. The wireless power transmission device of claim 1, wherein the impedance matching part is located at a front end of the power transmitter, and matches impedances of the power transmitter and a front end of the impedance matching part.

5. A wireless power transmission system comprising:
  the wireless power transmission device of claim 1; and
  at least one wireless power reception device including a power receptor having the same resonance frequency as the power transmitter of the wireless power transmission device, the power receptor being resonance-coupled to the power transmitter.

6. The wireless power transmission system of claim 5, wherein the controller comprises:
  a monitoring part configured to monitor a change in power transmission efficiency on the basis of information regarding received power received from the wireless power reception device and information regarding power transmitted from the wireless power transmission device;
  an operation part configured to calculate an impedance of the impedance matching part at which the power transmission efficiency is maximum by using the power transmission efficiency calculated by the monitoring part; and
  a switch manipulation part configured to control the switches of the impedance matching part to make the impedance matching part have the impedance calculated by the operation part.

7. The wireless power transmission system of claim 6, wherein the matching inductor has an inductance satisfying the following formula:

$$Lp > \frac{\frac{8}{\pi^2} V_{in}^2}{2\pi f P_{req}} \frac{Q}{\sqrt{1 + U_1^2 + U_2^2}} \sqrt{1 - \left(1 - \frac{R_s\sqrt{1 + U_1^2 + U_2^2}}{\frac{8}{\pi^2} V_{in}^2}\right)\left(1 + \frac{1}{\left(\frac{Q}{\sqrt{1 + U_1^2 + U_2^2}}\right)^2}\right)}$$

wherein $U_i = k_i\sqrt{Q_s Q_o}$, Qs represents a Q factor of a power transmitter coil, Qo represents a Q factor, and Ki represents a coupling coefficient, and
Lp represents the inductance of the matching inductor, Vin represents a direct-current (DC) voltage applied to the wireless power transmission device, and Preq represents power requested by the wireless power reception device.

8. The wireless power transmission system of claim 5, further comprising a communication part configured to receive information regarding received power from the wireless power reception device, and transmit the information regarding the received power to the controller.

9. The wireless power transmission system of claim 5, wherein the impedance matching part is located at a front end of the power transmitter and matches impedances of the power transmitter and a front end of the impedance matching part.

* * * * *